United States Patent
Barker et al.

(10) Patent No.: US 12,336,150 B2
(45) Date of Patent: Jun. 17, 2025

(54) CLIP-ON DIELECTRIC THERMAL DISSIPATION FINS

(71) Applicant: Hamilton Sundstrand Corporation, Charlotte, NC (US)

(72) Inventors: Matthew A. Barker, Byron, IL (US); Francis C. Belisle, Beloit, WI (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 602 days.

(21) Appl. No.: 17/716,647

(22) Filed: Apr. 8, 2022

(65) Prior Publication Data
US 2023/0328931 A1    Oct. 12, 2023

(51) Int. Cl.
G06F 1/16    (2006.01)
H05K 5/00    (2025.01)
H05K 7/00    (2006.01)
H05K 7/20    (2006.01)

(52) U.S. Cl.
CPC .............................. H05K 7/20418 (2013.01)

(58) Field of Classification Search
CPC ........... H05K 7/20418; H05K 7/20409; H05K 7/2039
See application file for complete search history.

(56) References Cited

U.S. PATENT DOCUMENTS

| | | | |
|---|---|---|---|
| 5,343,362 A | 8/1994 | Solberg | |
| 5,893,409 A * | 4/1999 | Kohler | H01L 23/4093 174/16.3 |
| 7,307,851 B2 * | 12/2007 | Dimarco | H05K 7/1425 361/752 |
| 7,355,858 B2 * | 4/2008 | Gruendler | H01L 23/4093 174/16.3 |
| 7,643,309 B1 * | 1/2010 | Lebo | H05K 7/20409 361/752 |
| 7,704,083 B1 * | 4/2010 | Cheyne | H01R 25/162 439/115 |
| 9,097,467 B2 * | 8/2015 | Gradinger | F28D 15/0233 |
| 9,554,485 B2 * | 1/2017 | LaPalme | H05K 7/20 |
| 9,655,280 B1 * | 5/2017 | Silverman | H05K 7/20545 |
| 10,237,965 B2 * | 3/2019 | Luskind | G06F 1/182 |
| 10,448,497 B2 * | 10/2019 | Ota | H05K 7/1427 |
| 2004/0031586 A1 * | 2/2004 | Rearick | H01L 23/4093 165/185 |
| 2008/0310119 A1 | 12/2008 | Giacoma | |

(Continued)

FOREIGN PATENT DOCUMENTS

DE    202015105289 U1    1/2016

OTHER PUBLICATIONS

Extended European Search Report dated Sep. 4, 2023, issued during the prosecution of European Patent Application No. EP 23166877.3.

*Primary Examiner* — Anthony M Haughton

(57) ABSTRACT

In accordance with at least one aspect of this disclosure, a system includes a heat sink. In embodiments, the heat sink can include, a fin body, having a first face and a second face, one or more fins extending vertically from the fin body, and a clip disposed on one of the first face and/or the second face configured to attach to a heat generating component of a LRU to dissipate heat energy from the heat generating component of the LRU to an ambient environment. In embodiments, the heat generating component can include a bus bar, for example.

20 Claims, 2 Drawing Sheets

(56) References Cited

U.S. PATENT DOCUMENTS

| | | | |
|---|---|---|---|
| 2014/0185194 A1* | 7/2014 | Mills | H05K 7/1457 |
| | | | 361/624 |
| 2018/0049307 A1* | 2/2018 | de Bock | H05K 1/0203 |
| 2018/0309350 A1* | 10/2018 | Socheleau | H02K 15/00 |
| 2023/0371197 A1* | 11/2023 | Setele | H05K 7/20418 |

* cited by examiner

CLIP-ON DIELECTRIC THERMAL DISSIPATION FINS

TECHNICAL FIELD

The present disclosure relates to heat dissipation fins.

BACKGROUND

Heat generating components often require additional heat sinks for thermal dissipation. These areas can often be tightly spaced, have strict dielectric spacing requirements, and may require protection from foreign objection entry (FOE) that can damage the electrical equipment in that area. Typical heat sinks can be made electrically conductive materials which require added insulation and may be fastened to the heat generating component using holes on or around the components which require additional thermal dissipation. Adding heat sinks made of conductive material to electrically conductive component increases the risk of violating dielectric spacing requirements along with equipment requirements of FOE fault prevention spacing.

There remains a need in the art for improved heat sinks that meet the spacing requirements and do not require additional dissipation components in order to mount the heat sink to the heat generating component. This disclosure provides a solution for this need.

SUMMARY

In accordance with at least one aspect of this disclosure, a system includes a heat sink. In embodiments, the heat sink can include, a fin body, having a first face and a second face, one or more fins extending vertically from the fin body, and a clip disposed on one of the first face and/or the second face configured to attach to a heat generating component of a Line Replaceable Unit (LRU) to dissipate heat energy from the heat generating component of the LRU to an ambient environment. In embodiments, the heat generating component can include a bus bar, for example.

In embodiments, the fins can extend vertically from the fin body, in two directions, beyond a height of the clip in both directions. In certain embodiments, the clip can extend from the first face and/or the second face perpendicular to the one or more fins.

In embodiments, the heat sink can be configured to extend laterally along an edge of the heat generating component parallel to a horizontal axis. In certain embodiments, the fin body can be a continuous fin body along an entire lateral length of the heat sink. In certain embodiments, the fin body can be a segmented fin body along an entire lateral length of the heat sink configured to articulate in a horizontal plane of heat generating component, relative to the horizontal axis.

In embodiments, the clip can be configured to slide onto the heat generating component and be held in place via mechanical compression. In certain embodiments, the clip can include an adhesive on an inward facing surface of the clip to secure the clip to the heat generating component.

In embodiments, the heat sink can be fabricated from a dielectric material, which can be or include a thermally conductive material. In certain embodiments, the thermally conductive material can include a polymer, a plastic, or a composite. In embodiments, the heat sink can be fabricated using additive manufacturing.

In certain embodiments, the heat sink can be configured to provide an electrically insulative barrier between the heat generating component to which the heat sink is attached and one or more adjacent heat generating components of the LRU. Additionally or alternatively, in certain embodiments, the heat sink can be configured to provide an electrically insulative barrier between an exposed electrically conductive component of the LRU and one or more adjacent surrounding electrically conductive components. In certain embodiments, the heat sink can be configured to cover exposed electrically conductive components.

In embodiments, the heat sink can be configured to be installed on the heat generating component after a design of the LRU has been determined and approved, and without redesigning the LRU. In certain embodiments, the system can include the LRU, and the heat sink can be configured to be installed on the heat generating component of the LRU after electrical components of the LRU have been assembled. In embodiments, the system can include a chassis configured to house the components of the LRU. The heat sink can be configured to attach to the chassis to provide an electrically insulative barrier between the chassis and electrically conductive foreign objects adjacent the chassis.

In accordance with at least one aspect of this disclosure, a clip-on heat sink for a LRU can include a body, a clip extending perpendicular to the body configured to accept a portion of a bus bar installed in the LRU and attach to the bus bar without a fastener, and one or more fins extending vertically from the body perpendicular to the clip. In certain embodiments, the body can include two or more bodies, and the clip includes two or more clips. In certain such embodiments, the two or more bodies can operatively connect to one another at articulating joints. In certain embodiments, the body, the clip and the one or more fins can form a unitary heat sink structure, for example formed by additive manufacturing.

In accordance with at least one aspect of this disclosure, a method can include forming a heat sink having one or more fins and a clip portion, installing the heat sink on one or more heat generating components of a LRU, and installing the one or more heat generating components in the LRU. In certain embodiments, the method can include designing a layout of components, including the one or more heat generating components, to be installed in a LRU, and installing the heat sink on the heat generating component can be performed after designing the layout and before installing the heat generating component in the LRU. In certain embodiments, installing the heat sink on the heat generating component can be performed after designing the layout and after installing the heat generating component in the LRU.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
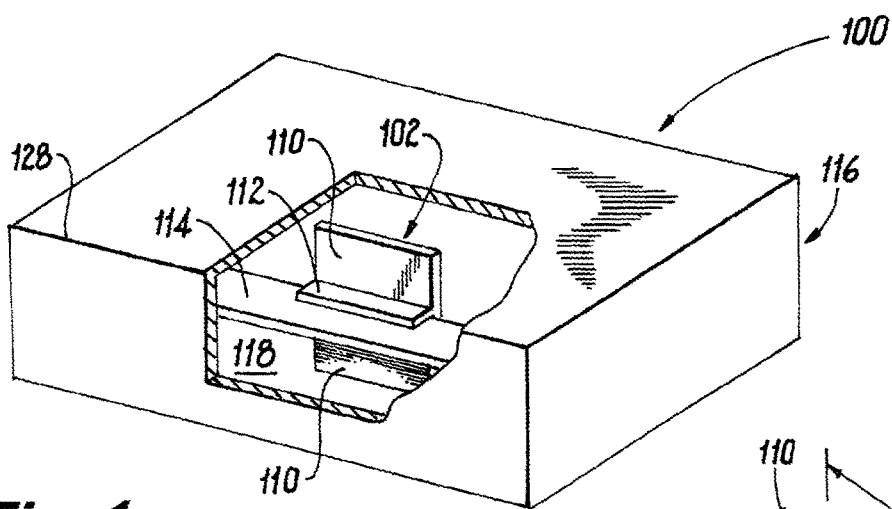
FIG. 1 is a schematic perspective view of a system in accordance with this disclosure, showing a heat generating component inside a line replaceable unit, having an embodiment of a heat sink thereon.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2-6.

Figure 2:
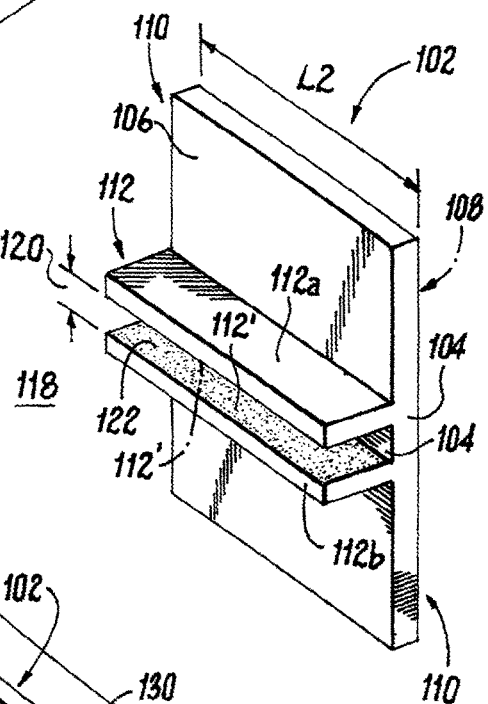
FIG. 2 is a perspective view of the heat sink of FIG. 1.
Figure 3:
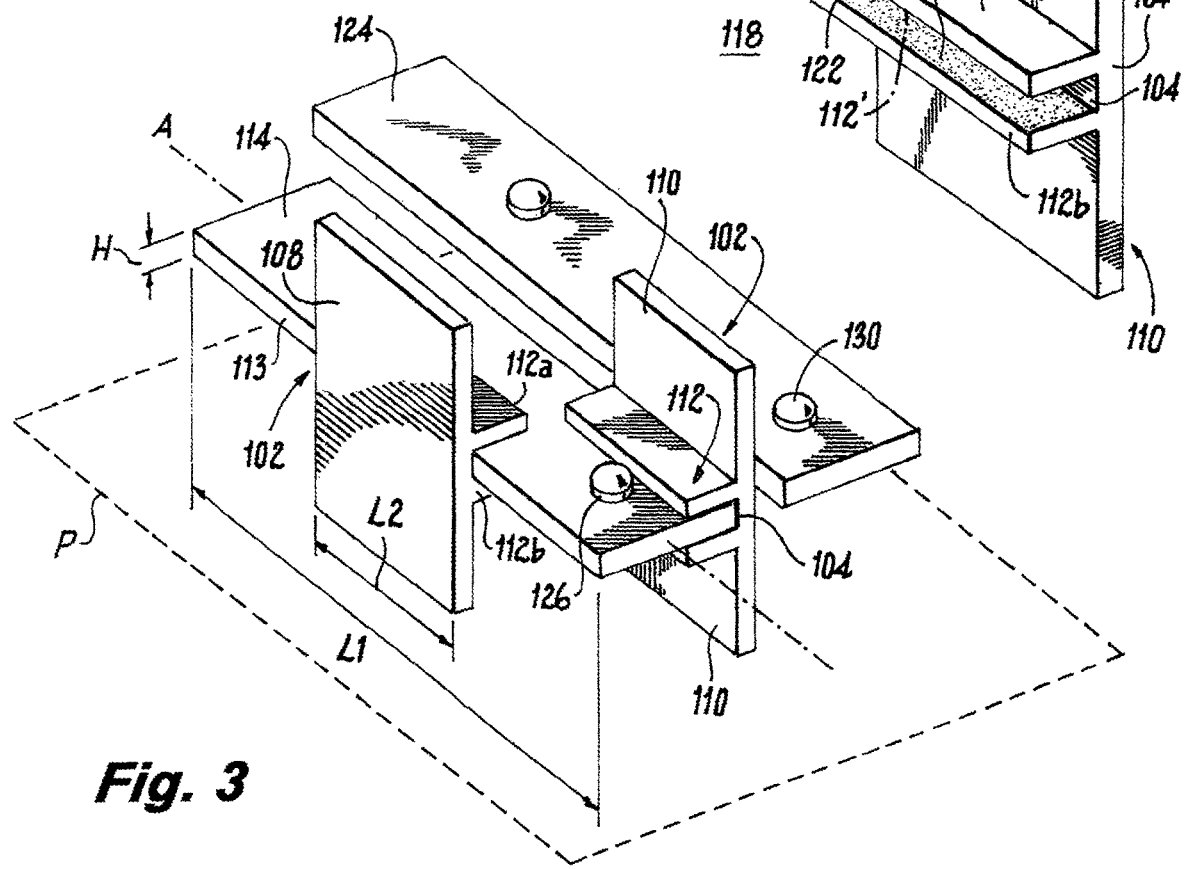
FIG. 3 is a perspective view of multiple of heat sinks of FIG. 1 attached to the heat generating component, relative to an adjacent heat generating component.

Referring to FIGS. 1-3, in accordance with at least one aspect of this disclosure, a system 100 includes a heat sink 102. In embodiments, the heat sink 102 can include a fin body 104, having a first face 106 and a second face 108 opposite the first face 106, one or more fins 110 extending vertically from the fin body 104, and a clip feature 112 disposed on one of the first face 106 and/or the second face 108 configured to attach to a heat generating component 114 of a LRU 116, or other electrical equipment, to dissipate heat energy from the heat generating component 114 to an ambient environment 118.

The clip 112 can include two opposed flanges 112a, 112b, each having an inward facing surface 112', the inward facing surface 112' configured to interface with an outer surface 114' of the heat generating component 114. The flanges 112a, 112b of the clip 112 can extend outward from the first face 106 and/or the second face 108 perpendicular to the one or more fins 110. A space 120 between flanges 112a, 112b can be tailored (e.g., during manufacturing) for a given application, for example to fit a thickness of a given heat generating component feature 114. In embodiments, the geometry of the flanges 112a, 112b may also be formed as needed for a given application.

In embodiments, the heat generating component feature 114 can include a bus bar 114, for example as shown, defining a horizontal axis A extending across a lateral length L1 of the bus bar 114. In embodiments, such as shown in FIG. 3, the fins 110 can extend vertically from the fin body 104, in two directions (e.g., upwards and downwards relative to the horizontal axis A) beyond a height of the clip 112 and a height H (e.g., thickness) of the bus bar 114 in both directions, however it is contemplated the fins 110 may extend only in one direction relative to the horizontal axis A based on available space or surrounding components. While the heat generating component/feature 114 is referred to herein below as "bus bar 114" for clarity, it will be understood by those having ordinary skill in the art that the heat generating component/feature 114 could include any suitable heat generating component or feature of an electronics unit.

In embodiments, the fin body 104, including the fins 110 and clip 112, can extend laterally along an edge 113 of the bus bar 114 along the horizontal axis A of the bus bar 114. In certain embodiments, as shown in FIGS. 1-3, the fin body 104 can be a continuous fin body 104 along an entire lateral length L2 of the heat sink 102. As shown in FIG. 3, the heat sink 102 can have a lateral length L2 less than the length L1 of the bus bar 114 to allow for multiple heat sinks 102 to be attached to the same bus bar 114 (e.g., staggered as shown), though it is possible for a single heat sink 102 to extend along the entire lateral length L1 of the bus bar 114 if needed or desired.

In embodiments, the clip 112 can be configured to slide onto the bus bar 114 and be held in place via mechanical compression, for example without being held in place with a fastener (e.g., bolts). This removes the need for additional electrically conductive components (e.g., the bolt itself), as well as allows the heat sinks 102 to be easily installed, removed, or moved as needed depending on LRU design. In certain embodiments, the clip 112 can include an adhesive 122 on the inward facing surface 112' of the clip to secure the clip to the bus bar 114 in applications where the LRU 116 is exposed to extreme conditions such as those experiencing high heat or vibration. In this case, the clip 112 can still attach the heat sink 102 to the bus bar 114 without a mechanical fastener. In such embodiments, the adhesive 122 can include any suitable adhesive capable of withstanding the described conditions.

In embodiments, the heat sink 102 can be fabricated from a dielectric material, which can be or include a highly thermally conductive material. The highly thermally conductive material can be a nontraditional material, for example in certain embodiments, the heat sink may not be made of ceramic or metal. In certain embodiments, the thermally conductive material can include a polymer, such as a plastic material, or a composite including a majority of a plastic mixed with the traditional ceramic to increase thermal conductivity as needed. In embodiments, the heat sink 102 can be fabricated using additive manufacturing, and in such cases, the thermally conductive dielectric material should be suitable for use with such a manufacturing process. In embodiments, the dielectric material can be flexible.

In certain embodiments, the geometry of heat sink 102 can be configured to provide an electrically insulative physical barrier between the bus bar 114 to which the heat sink 102 is attached and one or more adjacent heat generating components 124 (e.g., another bus bar 124) of the LRU 116, for example, as shown in FIG. 2, where another bus bar 124 is shown adjacent the bus bar 114. While in FIG. 2 the second bus bar 124 is shown in a common plane, the heat sink 102 is configured to provide an electrically insulate physical barrier between any additional electrically conductive components in a line of sight of the component 114 upon which the heat sink 102 is attached.

Additionally or alternatively, in certain embodiments, the heat sink 102 can be configured to provide a physical electrically insulative barrier between an exposed electrically conductive component 126 of the LRU 116 (e.g., an electrically connected bolted joint 126 mounting the bus bar to another component) and one or more adjacent surrounding electrically conductive components or chassis 128 (e.g., a grounded chassis 128) or other electrical conductor 130 at any potential. In certain embodiments, the heat sink 102 can be configured to cover exposed the electrically conductive components 130, for example to prevent or mitigate the possibility of a conductive FOE, bridging the dissimilar electrical conductors, while still providing additional thermal dissipation.

Typically, when a LRU 116 is to be assembled, the layout and internal design of the LRU 116 must be submitted for approval by a customer and/or a regulatory body. Once the layout has been approved, any subsequent changes to the design, including the location of heat sinks 102 on components 114, must then be resubmitted for re-approval. This can extend the design and manufacturing processes, as well as increase costs. In embodiments, because the heat sink 102 is made from dielectric material, and can be easily fitted onto the bus bars 114 without fasteners, the heat sink 102 can be configured to be installed on the bus bar 114 after the design of the LRU 116 has been determined and approved, without requiring any re-approval or redesigning of the LRU 116. In embodiments, this can also allow the heat sink 102 be installed on the bus bar 114 after the electrical components of the LRU have already been assembled.

In embodiments, the system 100 can include the chassis 128 to house the electrical components of the LRU 116. The heat sink 102 can also be configured to attach to the electrical conductive heat generating feature (e.g., bus bar) 114 to provide an electrically insulative barrier between the bus bar 114 and an electrical conductive material enclosure or chassis 128. This configuration reduces the potential for electrically conductive foreign objects to come into contact with the adjacent chassis enclosure 128. This can also facilitate physical protection of wiring/harnesses or personnel maintenance access.

Figure 4:
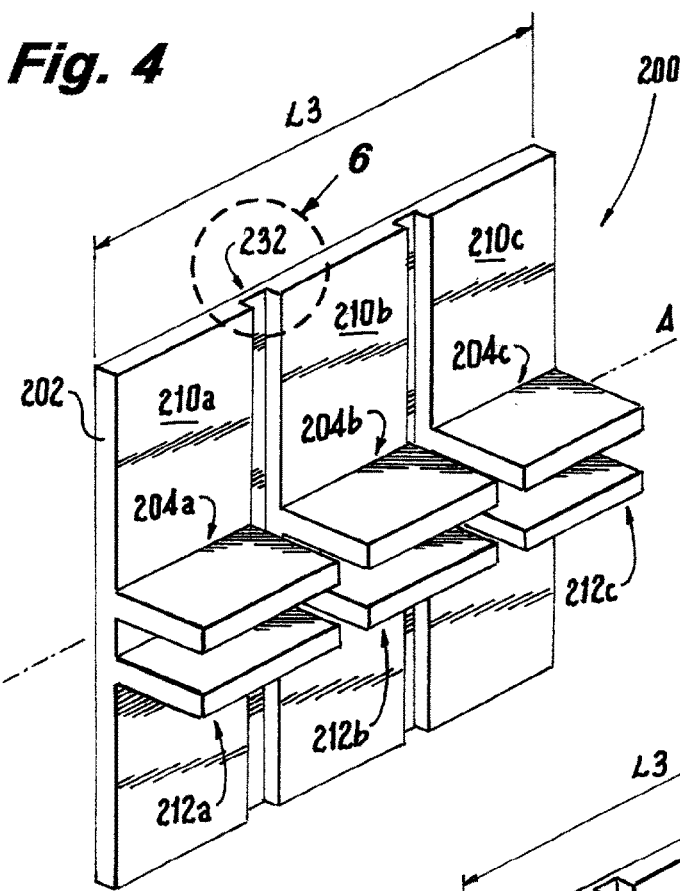
FIG. 4 is a perspective view of another embodiment of a heat sink.
Figure 5:
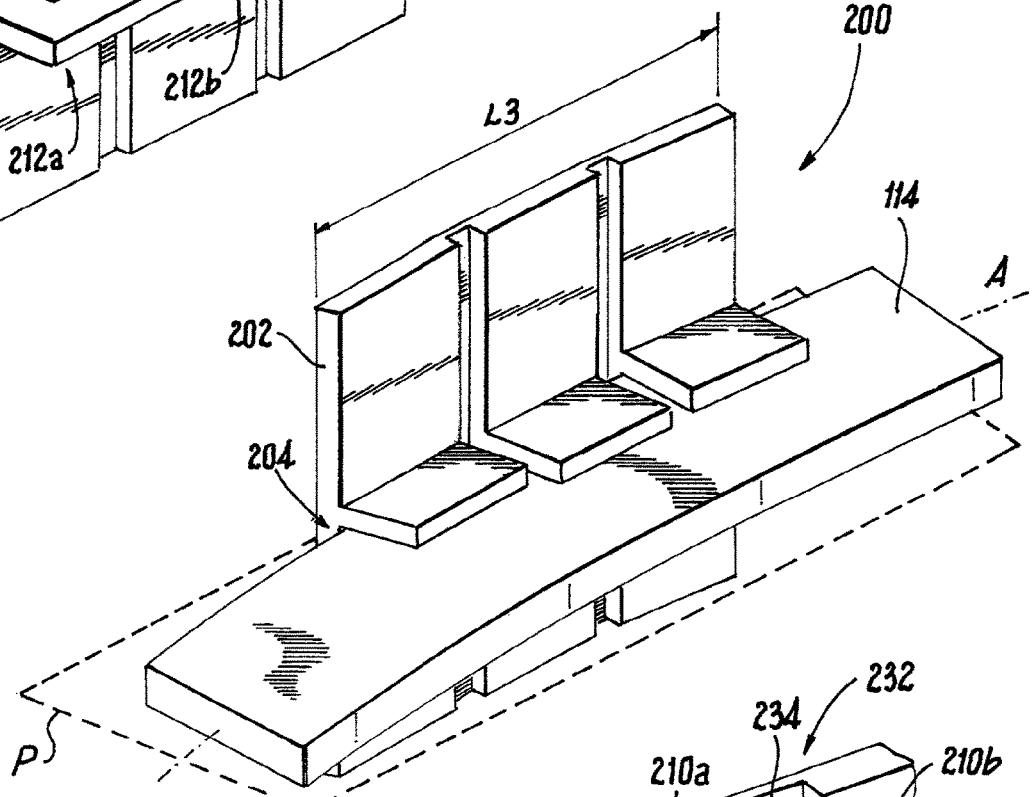
FIG. 5 is a perspective view of the heat sink of FIG. 4 attached to a heat generating component.
Figure 6:
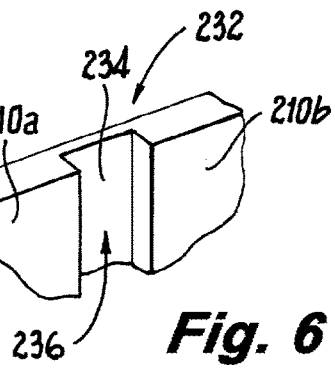
FIG. 6 is an enlarged partial view of the heat sink of FIGS. 4 and 5, showing an articulating joint.

Turning to FIGS. 4-6, in certain embodiments, a system 200 can be similar to that of system 100, for example system 200 can have similar components and features with respect to systems 100. For brevity, the description of common elements that have been described above for system 100 are not repeated with respect to system 200 as shown in FIGS. 4-6.

In system 200, the heat sink 202 can include a segmented fin body 204 fin body along an entire lateral length L3 of the heat sink 202. More specifically, the body 204 can include two or more bodies 204a, 204b, 204c, and the clip includes two or more clips 212a, 212b, 212c, each body having one clip 212 (e.g., two flanges), and one or more fins 210a, 210b, 210c. The bodies 204 can operatively connect to one another at articulating joints 232 configured to articulate in the horizontal plane P of bus bar 114, relative to the horizontal axis A, for example to account for, non-square, rounded, or more complex geometry of the corresponding bus bar 114 or other heat generating component. As can be seen more clearly in FIG. 6, the articulating joints 232 can include a thinned face 234 bridging a gap 236 between the fin bodies 204 and fins 210, where the thinned face 234 is flexible so as to allow the movement of the segments relative to one another in the plane P.

In accordance with at least one aspect of this disclosure, embodiments include a clip-on heat sink (e.g., heat sink 102, 202) for a LRU (e.g., LRU 116), the heat sink having a body (e.g., body 104, 204), a clip (e.g., clip 112, 212) extending perpendicular to the body configured to accept a at least a portion of a bus bar (e.g., bus bar 114) installed in the LRU and attach to the bus bar without a fastener, and one or more fins extending (e.g., fins 110, 210) vertically from the body perpendicular to the clip. In embodiments, the body 104, 204, the clip 112, 212 and the one or more fins 110, 210 can form a unitary heat sink structure (e.g., as shown), for example formed by additive manufacturing.

In accordance with at least one aspect of this disclosure, a method can include, designing a layout of components including one or more heat generating components (e.g., bus bar 114) to be installed in a LRU (e.g., LRU 116). The method can include forming a heat sink (e.g., heat sink 102, 202) having at one or more fins (e.g., fins 110, 210) and a clip (e.g., clip 112, 212), and installing the heat sink on one or more of the one or more heat generating components. The method can also include, installing the one or more heat generating components into the LRU, to assemble the LRU. In certain embodiments, installing the heat sink on the heat generating component can be performed after designing the layout but before installing the heat generating component in the LRU. In certain embodiments, installing the heat sink on the heat generating component can be performed after designing the layout and also after installing the heat generating component in the LRU.

Embodiments include a clip on heat fin fabricated from a dielectric material that can be attached to an electrically conductive element so as to provide an added heat fin area on a heat source component or bus bar. The fin geometry can provide a physical barrier (e.g., insulator) for foreign object debris (FOD) faults. As used herein, FOD can refer to loose washers, bolts or other hardware that is not in its place or not part of the approved design, such as manufacturing object debris. In embodiments, the fin heights above and below the clip can be adjusted to achieve maximized heat rejection area for clearances and dimensions required for FOD fault prevention. In embodiments, the fins are attached by clip on feature having different gap or width openings. In embodiments, the fins can be secured with adhesive in the applications involving harsh environments. In embodiments, the heat sink can provides an insulation or line of sight barrier between adjacent electrical conductors (e.g., as shown in FIG. 2), which can eliminate the need for pure physical space barriers in order to comply with regulations.

In embodiments, the heat sinks could be additively manufacturing (e.g., using 3D printing extrusion) in strips from thermally conductive dielectric materials with geometry appropriate for the given application. In embodiments, the clip on fins can be manufactured in strips with the geometry appropriate for the installation application at the clip-on interface (e.g., the thickness) and fin heights above and below the clip-on interface. Using additive manufacturing, the form of the heat sink, including fin heights, body segments, and overall profile could be optimized for the installation design location.

The clip can be a slide on, mechanical compression fit heat fin fabricated of a dielectric material (e.g., not traditional metal or ceramic), but may include some of the traditional materials if needed to increase the thermal conductivity of the dielectric, for example as a composite. Plastic dielectric material is much lighter than the traditional materials, which allows for more sinks to be included, without adding additional weight. Traditional heat sinks, including those made of metal or ceramic, may not be as efficient as rejecting heat, and may also allow for electrical losses. The dielectric material of the heat sink disclosed herein provides for improved heat rejection, as well as preventing electrical losses.

In embodiments, the clip on fins can be installed after the electric joints have been assembled, (torqued, inspected, etc.) as well as can be attached either to the electrical conductor or the adjacent chassis or structure edges for dielectric spacing for FOD fault propagation prevention. In embodiments, the clip on fins can be added later in the design process when necessary, without the need for a significant redesign. The clip on fins could be installed on the chassis for facilitating physical protection of wiring/harnesses or even personnel maintenance access.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A system, comprising:
    a heat sink including:
        a fin body having a first face and a second face;
        one or more fins extending vertically from the fin body; and
        a clip having a first flange and a second flange, the second flange opposed to the first flange and separated from the first flange by a space;
    wherein the clip is disposed on one of the first face or the second face and is configured to attach the heat sink to a heat generating component of a Line Replaceable Unit (LRU) to dissipate heat energy from the heat generating component of the LRU to an ambient environment.

2. The system of claim 1, wherein the one or more fins extend vertically from the fin body, in two directions, beyond a height of the clip in both directions, and wherein the clip extends from one of the first face or the second face perpendicular to the one or more fins.

3. The system of claim 2, wherein the fin body is configured to extend laterally along an edge of the heat generating component parallel to a horizontal axis of the heat generating component, and wherein the fin body is a continuous fin body along an entire lateral length of the heat sink.

4. The system of claim 2, wherein the fin body is configured to extend laterally along an edge of the heat generating component parallel to a horizontal axis of the heat generating component, and wherein the fin body is a segmented fin body along an entire lateral length of the heat sink configured to articulate in a horizontal plane of the heat generating component relative to the horizontal axis.

5. The system of claim 1, wherein the clip is configured to slide onto the heat generating component and be held in place via mechanical compression.

6. The system of claim 5, wherein the clip includes an adhesive on an inward facing surface of at least one of the first flange or the second flange to secure the clip to the heat generating component.

7. The system of claim 1, wherein the heat sink is fabricated from a dielectric material.

8. The system of claim 7, wherein the dielectric material includes a thermally conductive material.

9. The system of claim 8, wherein the thermally conductive material includes a polymer.

10. The system of claim 8, wherein the heat sink is fabricated using additive manufacturing.

11. The system of claim 8, wherein the heat sink is configured to provide an electrically insulative barrier between the heat generating component to which the heat sink is attached and one or more adjacent heat generating components of the LRU.

12. The system of claim 11, wherein the heat sink is configured to provide an electrically insulative barrier between an exposed electrically conductive component of the LRU and one or more adjacent surrounding electrically conductive components.

13. The system of claim 12, wherein the heat sink is configured to cover exposed electrically conductive components of the LRU.

14. The system of claim 13, further comprising a chassis configured to house the LRU, wherein the heat sink is configured to provide an electrically insulative barrier between the chassis and the heat generating component.

15. The system of claim 1, wherein the heat generating component includes a bus bar.

16. A clip-on heat sink for a Line Replaceable Unit (LRU), comprising:
    a body;
    a clip having a first flange and a second flange, the second flange opposed to the first flange and separated from the first flange by a space, the first flange and the second flange extending perpendicular to the body and configured to accept, between the first and second flanges, a portion of a bus bar installed in the LRU and attach to the bus bar without a fastener; and
    one or more fins extending vertically from the body perpendicular to the clip.

17. The clip-on heat sink of claim 16, wherein the body includes two or more bodies, the clip includes two or more clips, and the two or more bodies operatively connect to one another at articulating joints.

18. The clip-on heat sink of claim 16, wherein the body, the clip, and the one or more fins form a unitary heat sink structure.

19. A method, comprising:
forming a heat sink having one or more fins and a clip, the clip having a first flange and a second flange, the second flange opposed to the first flange and separated from the first flange by a space;
installing the heat sink on one or more heat generating components of a Line Replaceable Unit (LRU); and
installing the one or more heat generating components in the LRU.

20. The method of claim 19, wherein installing the heat sink is performed after designing a layout and after installing the one or more heat generating components in the LRU.

* * * * *